(12) United States Patent
Lin et al.

(10) Patent No.: US 10,636,873 B2
(45) Date of Patent: Apr. 28, 2020

(54) METHOD OF FABRICATING SEMICONDUCTOR DEVICE

(71) Applicant: Vanguard International Semiconductor Corporation, Hsinchu (TW)

(72) Inventors: Chih-Wei Lin, Jhubei (TW); Tsung-Han Lin, Hsinchu (TW); Chao-Wei Wu, Changhua (TW); Yen-Kai Chen, Taoyuan (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 125 days.

(21) Appl. No.: 15/821,177

(22) Filed: Nov. 22, 2017

(65) Prior Publication Data

US 2019/0157392 A1 May 23, 2019

(51) Int. Cl.
*H01L 29/08* (2006.01)
*H01L 21/02* (2006.01)
(Continued)

(52) U.S. Cl.
CPC ...... *H01L 29/0847* (2013.01); *H01L 21/0274* (2013.01); *H01L 21/266* (2013.01); *H01L 21/26513* (2013.01); *H01L 29/6659* (2013.01)

(58) Field of Classification Search
CPC ............. H01L 29/0847; H01L 21/0274; H01L 21/26513; H01L 21/266
(Continued)

(56) References Cited

U.S. PATENT DOCUMENTS 5,523,250 A * 6/1996 Jeong .................. H01L 29/6659
438/297
5,753,557 A * 5/1998 Tseng ................ H01L 21/28518
257/E21.165
(Continued)

FOREIGN PATENT DOCUMENTS

TW 494580 B 7/2002

OTHER PUBLICATIONS

Taiwanese Office Action and Search Report for Taiwanese Application No. 106121554, dated Mar. 14, 2018.
(Continued)

*Primary Examiner* — Sheikh Maruf
(74) *Attorney, Agent, or Firm* — Birch, Stewart, Kolasch & Birch, LLP

(57) ABSTRACT

A method of fabricating a semiconductor device is provided. In the method, a gate structure is formed on a semiconductor substrate. A photolithography process is performed with a mask having two transparent regions to form a photoresist layer having two openings in the semiconductor substrate. A first photoresist layer of the photoresist layer between the two openings is aligned to the gate structure and formed on the gate structure. The width of the first photoresist layer is shorter than the width of the gate structure such that a first side portion and a second side portion of the gate structure are exposed from both sides of the first photoresist layer, respectively. Next, an ion implantation process is performed to form lightly doped drain regions in the semiconductor substrate which are on two opposite sides of the gate structure of the photoresist layer.

10 Claims, 7 Drawing Sheets

(51) Int. Cl.
   *H01L 21/027* (2006.01)
   *H01L 21/266* (2006.01)
   *H01L 29/66* (2006.01)
   *H01L 21/265* (2006.01)

(58) Field of Classification Search
   USPC .................................................. 438/301
   See application file for complete search history.

(56) References Cited

U.S. PATENT DOCUMENTS

| | | | | |
|---|---|---|---|---|
| 6,046,090 | A * | 4/2000 | Wu | H01L 21/2652 438/303 |
| 6,171,914 | B1 * | 1/2001 | Liao | H01L 21/823814 257/E21.634 |
| 6,660,595 | B2 * | 12/2003 | Rodder | H01L 21/26586 257/E21.345 |
| 2003/0001206 | A1 * | 1/2003 | Negoro | H01L 21/823857 257/336 |
| 2005/0064671 | A1 * | 3/2005 | Hao | H01L 21/26586 438/305 |
| 2005/0184335 | A1 * | 8/2005 | Gi Lee | H01L 29/0847 257/327 |
| 2005/0250050 | A1 * | 11/2005 | Chen | H01L 29/66757 430/313 |
| 2005/0285189 | A1 * | 12/2005 | Shibib | H01L 29/402 257/341 |
| 2006/0011981 | A1 * | 1/2006 | Lee | H01L 21/823807 257/347 |
| 2007/0278568 | A1 * | 12/2007 | Williams | H01L 21/761 257/335 |
| 2008/0185666 | A1 * | 8/2008 | Yoo | H01L 29/0692 257/408 |
| 2010/0052057 | A1 * | 3/2010 | Chung | H01L 29/0634 257/362 |
| 2010/0244131 | A1 * | 9/2010 | Bulucea | H01L 29/7835 257/336 |
| 2011/0108917 | A1 * | 5/2011 | Shima | H01L 29/0847 257/344 |
| 2011/0193160 | A1 * | 8/2011 | Loechelt | H01L 21/743 257/337 |
| 2014/0027811 | A1 * | 1/2014 | Chen | H01L 29/7436 257/137 |
| 2014/0035033 | A1 * | 2/2014 | Lim | H01L 29/66681 257/338 |
| 2014/0291759 | A1 * | 10/2014 | Zhao | H01L 29/66598 257/336 |
| 2015/0236139 | A1 * | 8/2015 | Huang | H01L 29/66977 257/9 |
| 2015/0348968 | A1 * | 12/2015 | Edwards | H01L 27/092 257/24 |
| 2015/0380521 | A1 * | 12/2015 | Chang | H01L 21/30608 438/285 |
| 2016/0064552 | A1 * | 3/2016 | Cheng | H01L 29/7835 257/343 |
| 2016/0260611 | A1 * | 9/2016 | Consiglio | H01L 21/2254 |
| 2017/0033216 | A1 * | 2/2017 | Chang | H01L 21/823462 |

OTHER PUBLICATIONS

Taiwanese Office Action and Search Report dated Feb. 11, 2020, for corresponding Taiwanese Application No. 106121554.

* cited by examiner

METHOD OF FABRICATING SEMICONDUCTOR DEVICE

BACKGROUND OF THE INVENTION

Field of the Invention

The present invention relates to semiconductor devices, and, in particular, to the fabrication method of semiconductor devices having lightly doped drains.

Description of the Related Art

In the processes used for manufacturing semiconductor devices, the sizes of these devices are continuously being reduced, largely by increasing the density of the devices and thereby enhancing their operation speed and performance. Take the MOS transistor for example: decreasing the length of the channel and the thickness of the gate oxide induces an increase of the vertical and horizontal electric field. The increased horizontal electric field accelerates the speed of carriers in the channel. When these carriers, which have been accelerated in the channel, have enough energy, this increases the probability that these carriers emit in, over, and through gate oxide to form a gate current, or to induce electron-hole pairs at the drain region. Therefore, when the channel of an MOS transistor shrinks, the amount of carriers in the channel near the drain region is increased to induce the hot electron effect. In the hot electron effect, some of the electrons are emitted in gate oxide, and the corresponding holes flow into the substrate and produce the substrate current. Some of the other holes are collected by the source region, and the effect of the NPN-bipolar transistor is enhanced, multiplying more carriers, and even causing an electrical breakdown.

With the above issues, conventional techniques provide lightly doped drains (LDD) to reduce or prevent semiconductor devices from being damaged by the hot electron effect. Using traditional fabricating methods, the lightly doped drain still needs to be improved, and the purpose of the present invention is to provide new fabricating methods of semiconductor devices having lightly doped drains.

BRIEF SUMMARY OF THE INVENTION

In accordance with one feature of the present invention, the present invention provides a method of fabricating a semiconductor device, which at least includes the following steps. A gate structure is formed on a semiconductor substrate. A photoresist layer is formed on the gate structure, wherein the photoresist layer has at least one narrow portion, and the width of the narrow portion is shorter than the width of the gate structure such that the gate structure has a first side portion and a second side portion exposed from both sides of the photoresist layer. Subsequently, an ion implantation process is performed to form lightly doped drain regions in the semiconductor substrate which are on two opposite sides of the gate structure.

The first side portion and the second side portion exposed from both sides of the photoresist layer have essentially the same width B. Furthermore, the width of the narrow portion of the photoresist layer is S, the width of the gate structure is L, and the L, B and S conform the rules of the fabrication capability. The power required for performing the ion implantation process is between 100 keV and 200 keV.

In accordance with another feature of the present invention, the present invention provides a method of fabricating a semiconductor device, which at least includes the following steps. A gate structure is formed on a semiconductor substrate. A photolithography process with a mask having two transparent regions is performed to form a photoresist layer having two openings in the semiconductor substrate, a first photoresist layer of the photoresist layer between the two openings is aligned to the gate structure and formed on the gate structure, and the width of the first photoresist layer is shorter than the width of the gate structure such that the gate structure has a first side portion and a second side portion exposed from both sides of the first photoresist layer. Subsequently, an ion implantation process is performed to form lightly doped drain regions in the semiconductor substrate which are on two opposite sides of the gate structure exposed from the photoresist layer.

The first side portion and the second side portion exposed from both sides of the first photoresist layer have essentially the same width B. Additionally, the width of the first photoresist layer is S, the width of the gate structure is L, and the L, B and S conform the respective rules of the fabrication capability. The power required for performing the ion implantation process is between 100 keV and 200 keV.

The following is a description of the present invention in detail with the example of the embodiments and with reference to the accompanying drawings.

DETAILED DESCRIPTION OF THE INVENTION

The following is a description of the various embodiments and aspects of the present invention. This description is made for the purpose of illustrating the general principles of the invention and should not be taken in a limiting sense. The scope of the invention is best determined by reference to the appended claims.

Figure 1A:
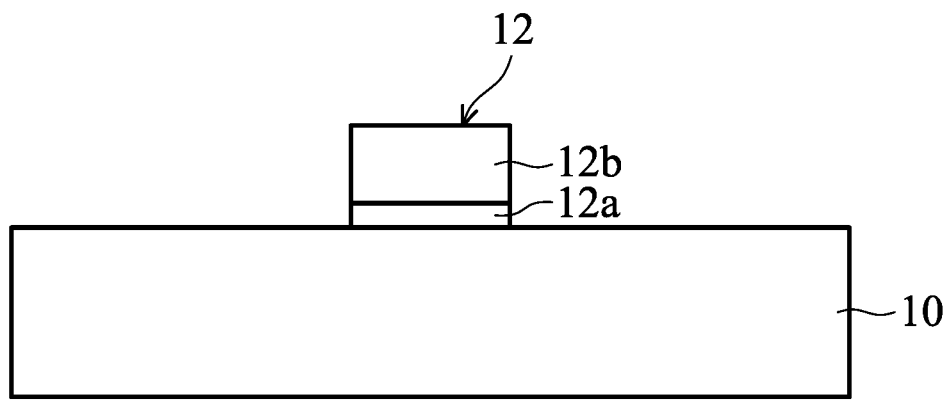
FIGS. 1A, 1B, and 1C illustrate a conventional fabricating flow of lightly doped drains.
Figure 1B:
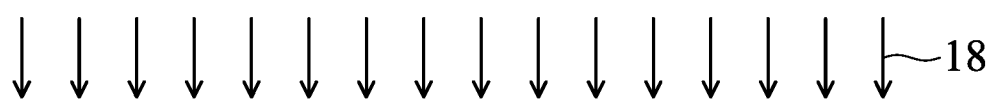
Figure 1B:
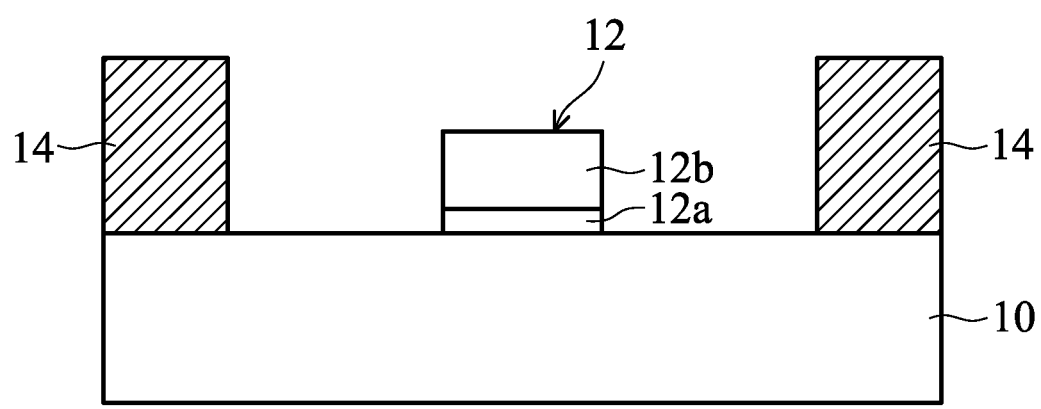
Figure 1C:
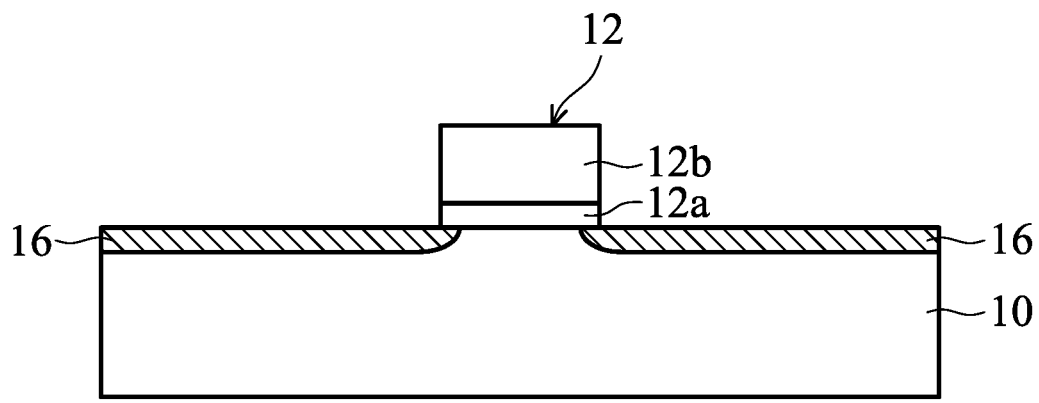
Figure 2:
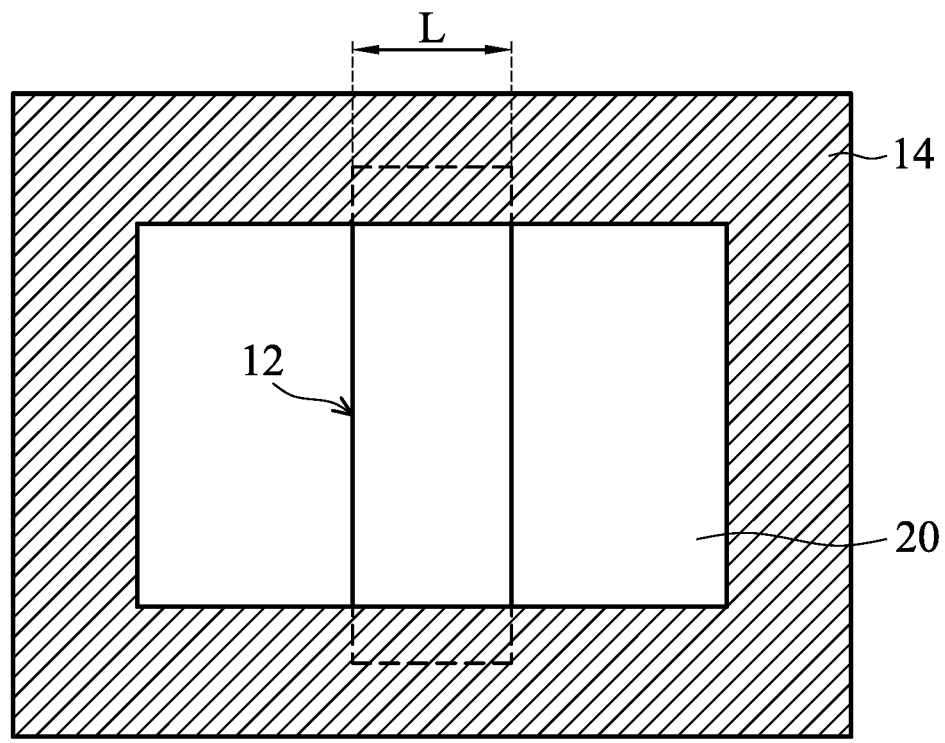
FIG. 2 shows a corresponding layout of the structure shown in FIG. 1.

FIGS. 1A, 1B, and 1C show the conventional fabricating flow of the lightly doped drain (LDD). In FIG. 1A, a gate structure 12 is formed on a semiconductor substrate 10. The semiconductor substrate 10, for example, is a doped-silicon, and the gate structure 12, for example, includes a gate oxide 12a and a doped-poly gate 12b, but it is not limited thereto. In FIG. 1B, a mask (not shown) is used with the photolithography processes to form a photoresist layer 14 on the semiconductor substrate 10. FIG. 2 shows a corresponding layout of the structure shown in FIG. 1. With FIGS. 1B and 2, the used mask (not shown) has a transparent region to define an opening 20 (FIG. 2) of the photoresist layer 14. Subsequently, an ion implantation process 18 is performed to form lightly doped drain regions 16. After the photoresist layer 14 is removed, the semiconductor device with lightly doped drain regions 16 is shown in FIG. 1C.

Figure 3A:
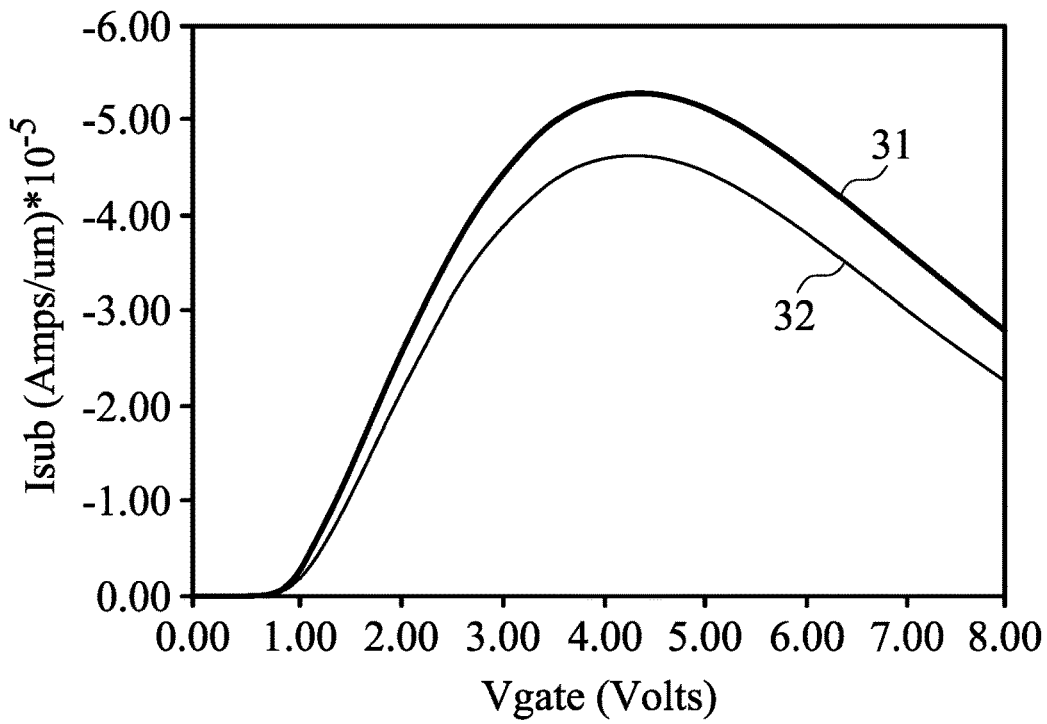
FIGS. 3A and 3B illustrate the electrical characteristics of MOS transistor formed with the layout shown in FIG. 2.
Figure 3B:
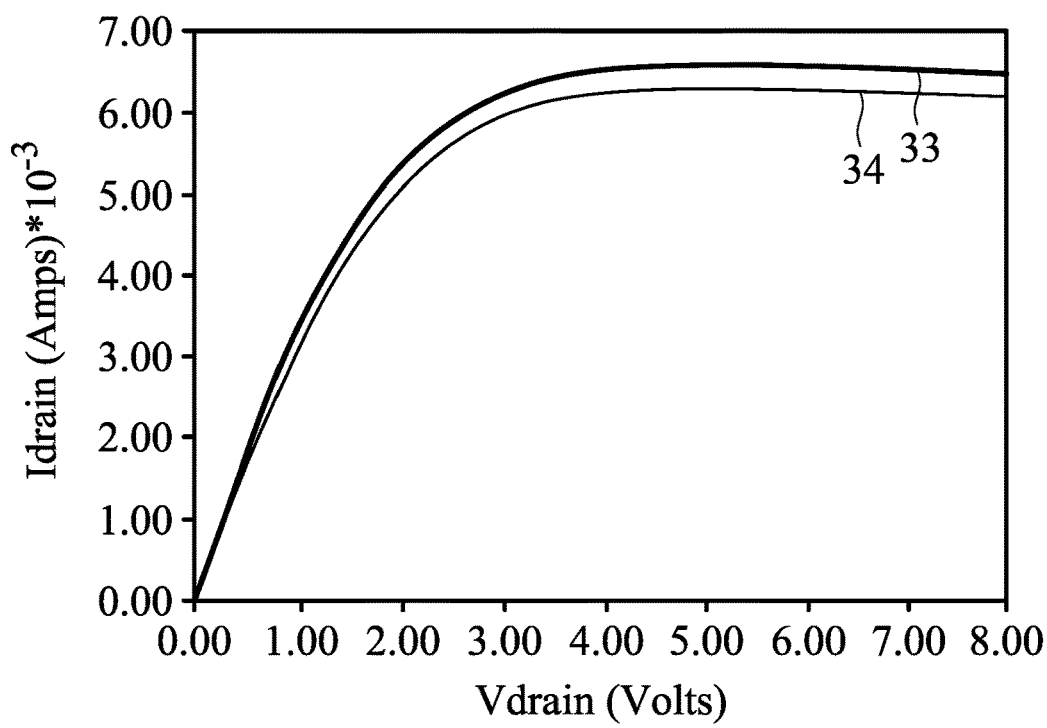

In the above conventional fabricating method of lightly doped drain, MOS transistor of the gate structure 12 is not covered by (or exposed from) the photoresist layer 14 in the opening 20. Thus, when the high energy ion implantation process is performed, high energy ions emit easily into the semiconductor substrate 10 through the gate structure 12, it induces drain to source punch-through leakage. Furthermore, using the layout structure shown in FIG. 2 as an example, the hot electron effect is still serious when the middle level voltage (5V-8V) is applied. Typically, the width of the gate structure 12 is increased (the channel length of MOS transistor is also accordingly increased) to reduce the horizontal electric field at high drain voltage for further reducing the hot electron effect. In FIG. 3A, the curve 31 represents the characteristics of a MOS transistor having 0.8 µm gate width L and the curve 32 represents the characteristics of a MOS transistor having 0.85 µm gate width L. As shown in FIG. 3A, while the width of the gate structure 12 is increased, the substrate current Isub is decreased. However, the increase of the gate structure 12 width may affect the size and the current drive capability of the semiconductor device. In FIG. 3B, the curve 34 represents the characteristics of a MOS transistor having 0.85 µm gate width L. As shown in FIG. 3B, while the width of the gate structure 12 is increased, the drain current Idrain is decreased.

Figure 4A:
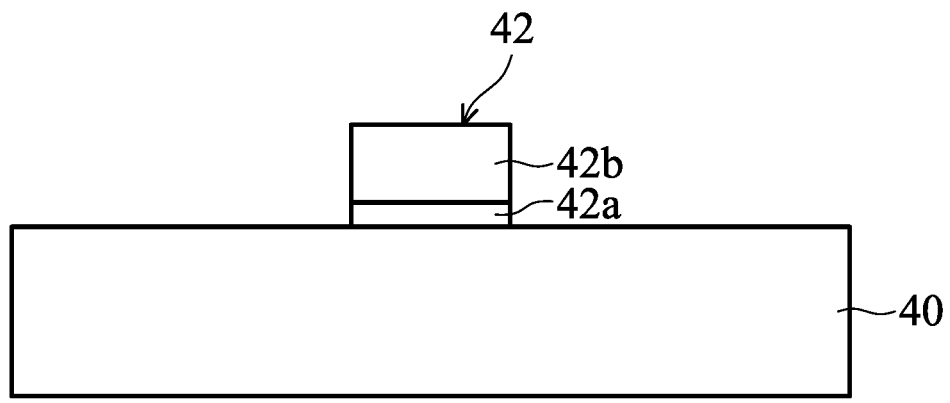
FIGS. 4A, 4B, and 4C illustrate the fabricating flow of the lightly doped drain, in accordance with some embodiments.
Figure 4B:
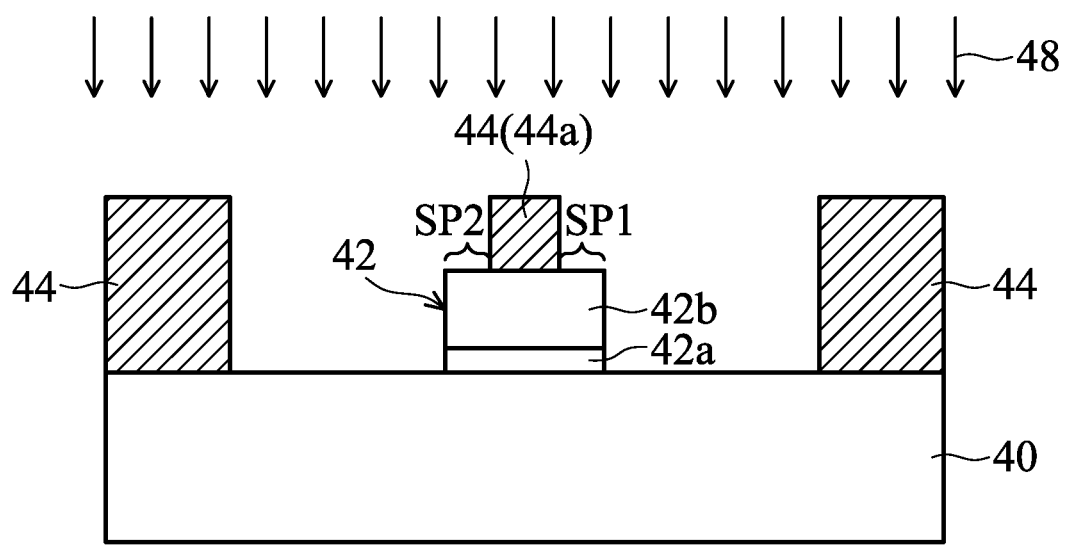
Figure 4C:
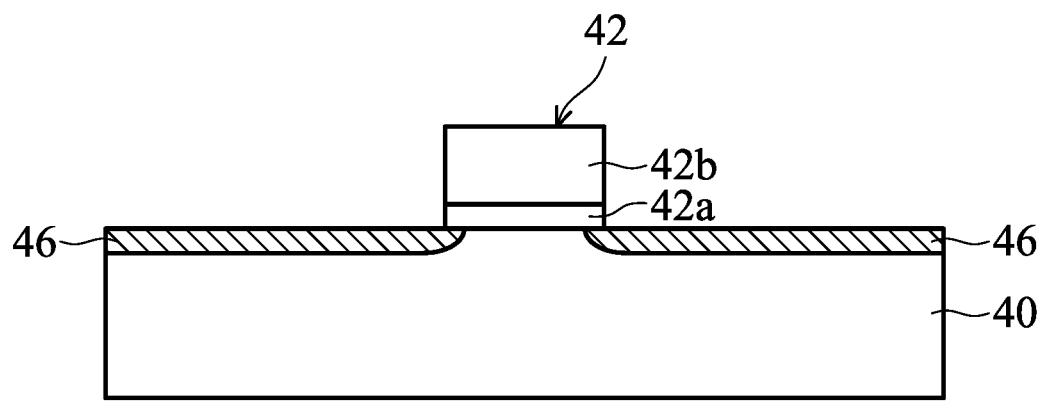
Figure 5:
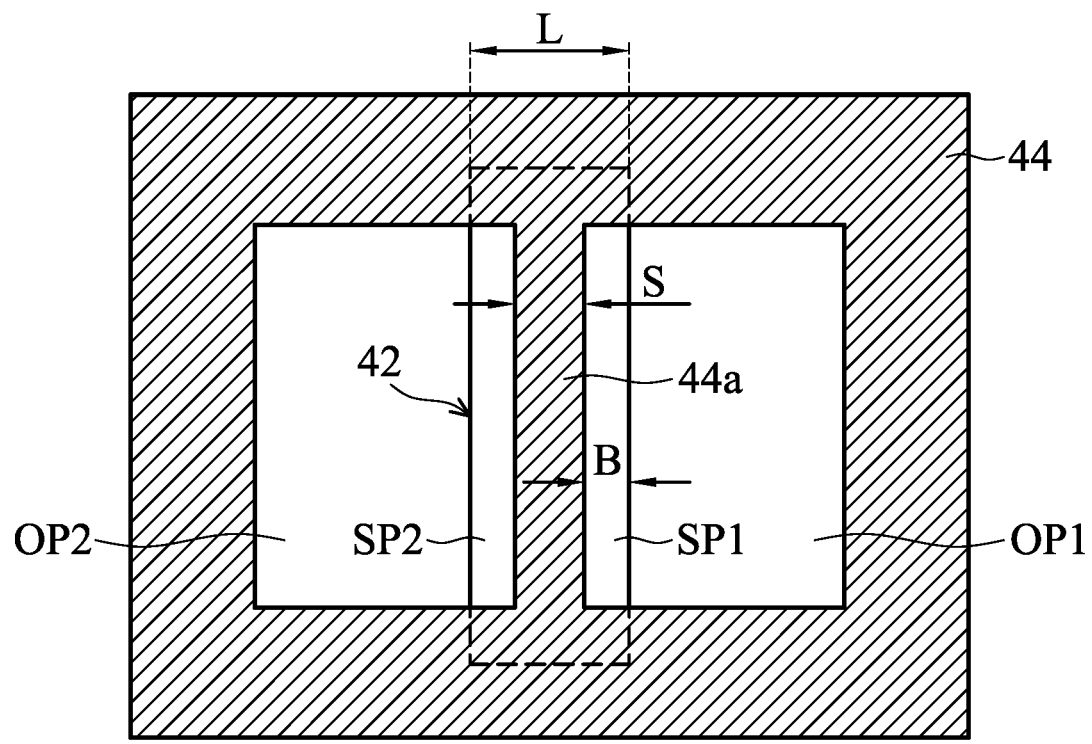
FIG. 5 shows a corresponding layout of the structure shown in FIG. 4B.

FIGS. 4A, 4B, and 4C show the fabricating flow of the lightly doped drain, in accordance with some embodiments of the invention. FIG. 5 shows a corresponding layout of the structure shown in FIG. 4B.

In FIG. 4A, a gate structure 42 is formed on a semiconductor substrate 40. The semiconductor substrate 40, for example, is the doped-silicon, and the gate structure 42, for example, includes a gate oxide 42a and a doped-poly gate 42b, but it is not limited thereto.

In FIG. 4B, a mask (not shown) is used with the photolithography processes to form a photoresist layer 44 having two openings OP1 and OP2 (shown in FIG. 5) on the semiconductor substrate 40. A first photoresist layer 44a of the photoresist layer 44 between the two openings OP1 and OP2 is aligned with the gate structure 42, and the width S of the first photoresist layer 44a is shorter than the width L of the gate structure 42 such that a first side portion SP1 and a second side portion SP2 of the gate structure 42 are exposed from both sides of the first photoresist layer 44a. In some embodiments, the first photoresist layer 44a can be regarded as a photoresist pattern of the photoresist layer 44.

Subsequently, an ion implantation process 48 is performed to form lightly doped drain regions 46 in the semiconductor substrate 40 which are on two opposite sides of the gate structure 42 exposed from the photoresist layer 44. After the photoresist layer 44 is removed, the structure of lightly doped drain regions 46 is shown in FIG. 4C. The power required for performing the ion implantation process is between 100 keV and 200 keV.

With reference to FIG. 5, the width of the gate structure 42 is L, the width of the first photoresist layer 44a is S, and the ratio of width S to width L (S/L) is between 3/4 and 5/8 in the embodiments of the present invention. For example, S/L can be 0.6 µm/0.8 µm, a better S/L is 0.55 µm/0.8 µm, and an even better S/L is 0.5 µm/0.8 µm. Furthermore, the first side portion SP1 and the second side portion SP2 of the gate structure 42, which are exposed from both sides of the first photoresist layer 44a, can have the same width B, but they also can have different widths. The width B is the distance between the boundary of the first photoresist layer 44a and the boundary of the gate structure 42. The width S is longer than the width B. When the first side portion SP1 and a second side portion SP2 have the same width B, L=S+2B.

Figure 6:
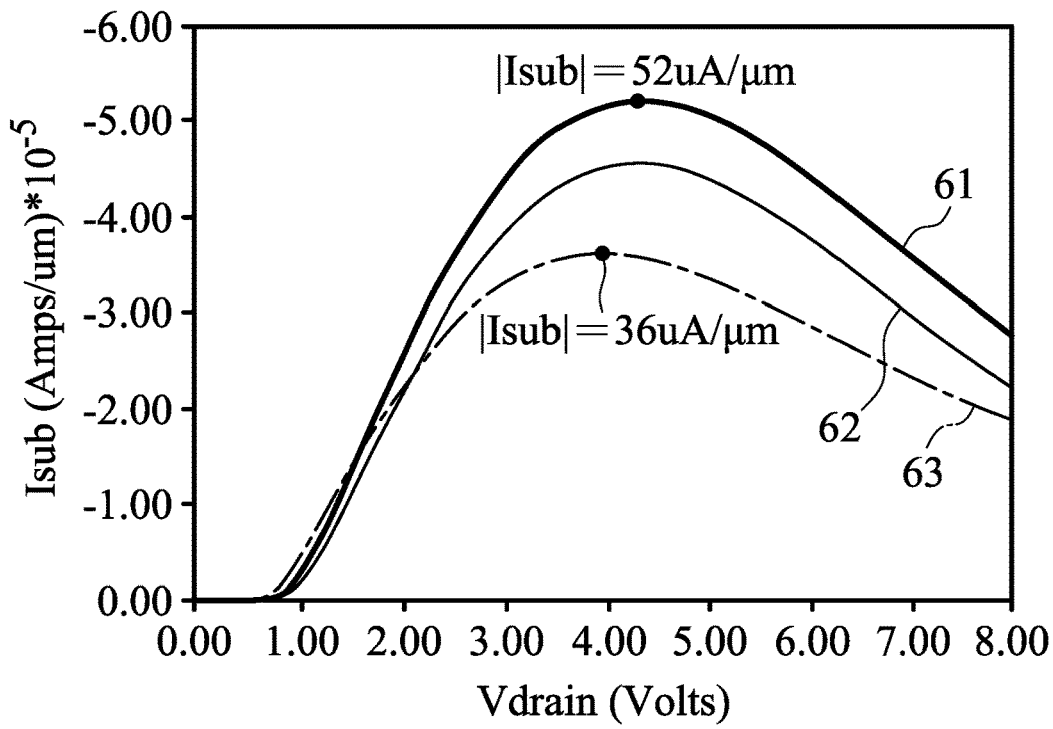
FIG. 6 illustrates the electrical characteristic diagram of MOS transistor that shows the substrate current Isub versus gate voltage Vgate.
Figure 7:
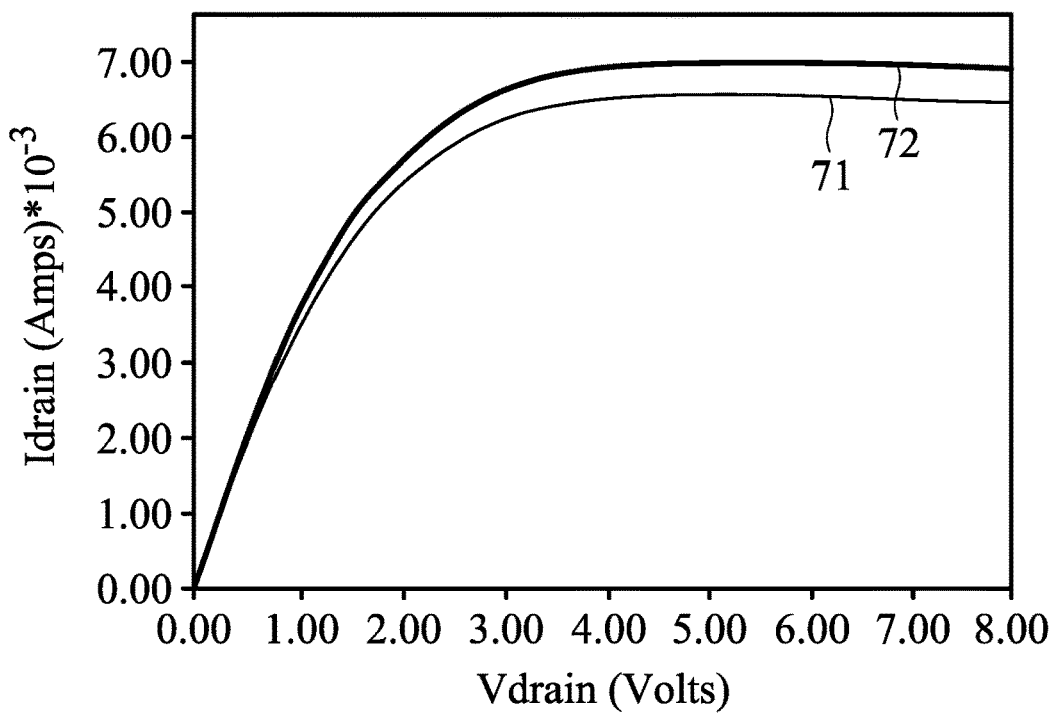
FIG. 7 illustrates the electrical characteristic diagram of the MOS transistor that shows the drain current Idrain versus drain voltage Vdrain.
Figure 8:
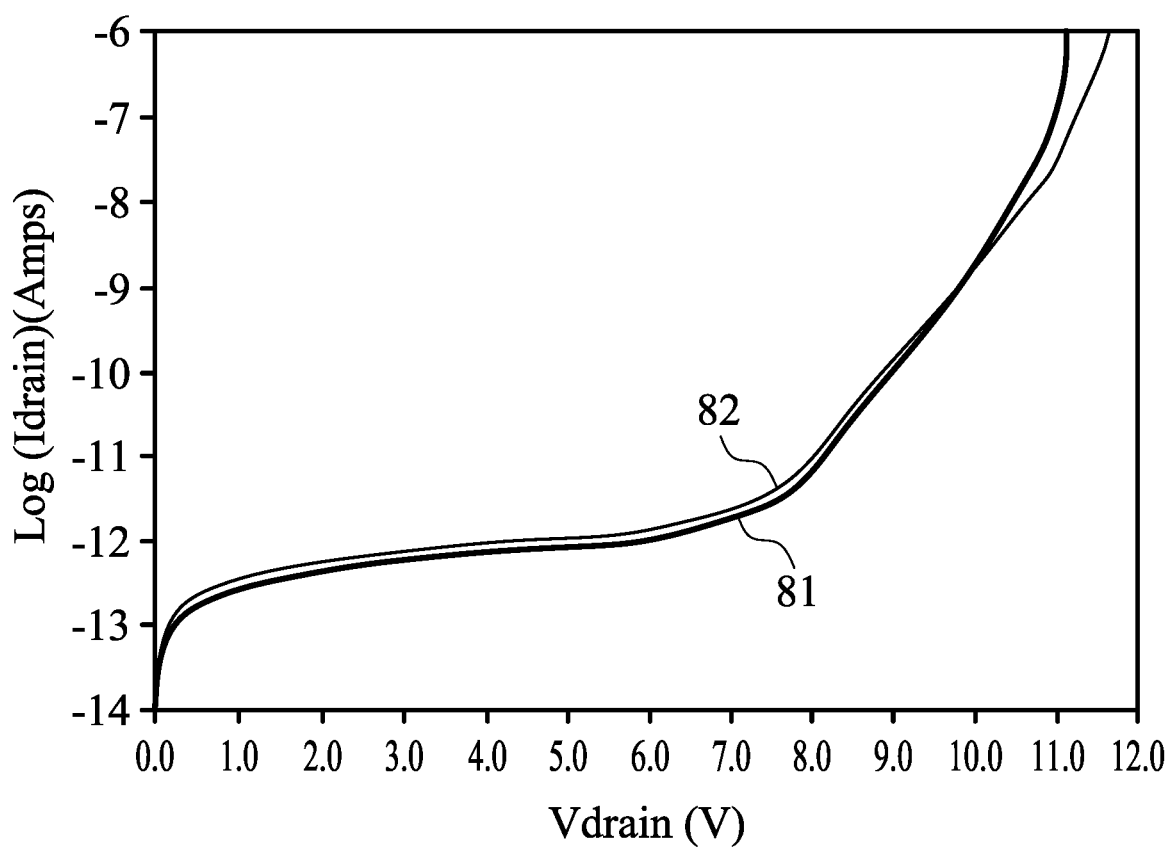
FIG. 8 illustrates the characteristics of the breakdown voltage of a MOS transistor.

FIGS. 6, 7 and 8 show the electrical characteristics of the MOS transistor having lightly doped drains which are formed by the fabricating methods of semiconductor devices according to embodiments of the present invention.

FIG. 6 is an electrical characteristic diagram that shows the substrate current Isub versus gate voltage Vgate of a MOS transistor. In FIG. 6, lightly doped drains of the MOS transistor corresponding to the curves 61, 62 are formed with the layout shown in FIG. 2 and the widths of the gate structures are 0.8 µm and 0.85 µm, respectively. The lightly doped drains of the MOS transistor corresponding to the curve 63 are formed with the layout shown in FIG. 5 according to the embodiments in the present invention and the width of the gate structure is 0.8 µm. From FIG. 6, it is obvious that the top value of the substrate current |Isub| in the invention can be reduced from about 52 of the curve 61 to 36 of the curve 63. It should be noted that, even though the gate structure width L (0.8 µm) of the MOS transistor corresponding to the curve 63 is not increased, the MOS transistor corresponding to the curve 63 has a better performance in reducing the substrate current Isub than the MOS transistor corresponding to the curve 62 (the width is increased to 0.85 µm).

FIG. 7 is an electrical characteristic diagram that shows the drain current Idrain versus drain voltage Vdrain of MOS transistor. In FIG. 7, lightly doped drains of the MOS transistor corresponding to the curve 71 are formed with the layout shown in FIG. 2 and the width of the gate structure is 0.8 µm. The lightly doped drains of the MOS transistor corresponding to the curve 72 are formed with the layout shown in FIG. 5 and the width of the gate structure is 0.8 µm. As shown in FIG. 7, the drain current Idrain of the MOS transistor corresponding to the curve 72 is greater than the drain current of the MOS transistor corresponding to the curve 71. It means that the current driving capability of the MOS transistor corresponding to the curve 72 is better than the current driving capability of the MOS transistor corresponding to the curve 71. Therefore, the current driving capability of the MOS transistor with the LDD implemented by the embodiments of the invention is not reduced.

FIG. 8 shows the characteristics of the breakdown voltage of a MOS transistor. In FIG. 8, lightly doped drains of the MOS transistor corresponding to the curve 81 are formed with the layout shown in FIG. 2 and the width of the gate structure is 0.8 µm. The Lightly doped drains of the MOS transistor corresponding to the curve 82 are formed with the layout shown in FIG. 5 and the width of the gate structure is 0.8 µm. The horizontal axis in FIG. 8 represents the drain voltage Vdrain and the vertical axis represents the logarithm value of the leakage drain current log (Idrain). As shown in FIG. 8, it can be seen that the breakdown characteristics of the MOS transistor with the LDD implemented by the embodiments of the invention are apparently not damaged.

In the fabrication method using the layout shown in FIG. 2, an ion implantation process is performed with a single opening (20) to fabricate lightly doped drains in the semiconductor substrate. In the fabrication method using the layout of FIG. 5 of the embodiments of the invention, an ion implantation process with two openings OP1 and OP2 is performed to fabricate lightly doped drains in the semiconductor substrate. In the embodiments of the invention, the substrate current can be reduced effectively without increasing the width L of the gate structure, thereby preventing any reduction in the current driving capability of MOS transistor and preventing any degradation of the breakdown characteristics of the MOS transistor.

What is claimed is:

1. A method of fabricating a semiconductor device, comprising:

forming a gate structure on a semiconductor substrate;

forming a photoresist layer on the gate structure, wherein the photoresist layer has at least one narrow portion, a width of the narrow portion is shorter than a width of the gate structure such that the gate structure has a first side portion and a second side portion exposed from both sides of the photoresist layer; and performing ion implantation process when the width of the narrow portion of the photoresist layer is shorter than the width of the gate structure to form lightly doped drain regions in the semiconductor substrate which are on two opposite sides of the gate structure, respectively.

2. The method of claim 1, wherein the width of the narrow portion of the photoresist layer is S, the width of the gate structure is L, a distance between a boundary of the narrow portion and a boundary of the gate structure is B, and S>B.

3. The method of claim 1, wherein the first side portion and the second side portion exposed from both sides of the photoresist layer have essentially the same width B.

4. The method of claim 3, wherein the width of the narrow portion of the photoresist layer is S, the width of the gate structure is L, L=S+2B, and S>B.

5. The method of claim 1, wherein power for performing the ion implantation process is between 100 keV and 200 keV.

6. A method of fabricating a semiconductor device, comprising:

forming a gate structure on a semiconductor substrate;

performing a photolithography process with a mask having two transparent regions to form a photoresist layer in the semiconductor substrate, wherein the photoresist layer has two openings, a first photoresist layer of the photoresist layer between the two openings is aligned to the gate structure and formed on the gate structure, and a width of the first photoresist layer is shorter than a width of the gate structure such that the gate structure has a first side portion and a second side portion exposed from both sides of the first photoresist layer, respectively; and performing ion implantation process when the width of the narrow portion of the photoresist layer is shorter than the width of the gate structure to form lightly doped drain regions in the semiconductor substrate which are on two opposite sides of the gate structure exposed from the photoresist layer, respectively.

7. The method of claim 6, wherein the width of the first photoresist layer is S, the width of the gate structure is L, a distance between a boundary of the first photoresist layer and a boundary of the gate structure is B, and S>B.

8. The method of claim 6, wherein the first side portion and the second side portion exposed from both sides of the first photoresist layer have essentially the same width B.

9. The method of claim 8, wherein the width of the first photoresist layer is S, the width of the gate structure is L, L=S+2B, and S>B.

10. The method of claim 6, wherein power for performing the ion implantation process is between 100 keV and 200 keV.

* * * * *